(12) United States Patent
Letavic et al.

(10) Patent No.: US 6,847,081 B2
(45) Date of Patent: Jan. 25, 2005

(54) DUAL GATE OXIDE HIGH-VOLTAGE SEMICONDUCTOR DEVICE

(75) Inventors: Theodore J. Letavic, Putnam Valley, NY (US); Mark R. Simpson, White Plains, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/015,847

(22) Filed: Dec. 10, 2001

(65) Prior Publication Data

US 2003/0107087 A1 Jun. 12, 2003

(51) Int. Cl.[7] .......................... H01L 27/01; H01L 27/12; H01L 31/0392
(52) U.S. Cl. ...................... 257/347; 257/367; 257/409; 257/487; 257/507
(58) Field of Search .................. 257/347, 364–367, 257/409, 487, 507, 355, 356, 359, 360

(56) References Cited

U.S. PATENT DOCUMENTS

| | | | | |
|---|---|---|---|---|
| 3,936,858 A | * | 2/1976 | Seeds et al. .................. 357/23 |
| 5,246,870 A | | 9/1993 | Merchant | |
| 5,300,448 A | | 4/1994 | Merchant et al. | |
| 5,362,979 A | * | 11/1994 | Merchant .................... 257/340 |
| 5,412,241 A | * | 5/1995 | Merchant .................... 257/409 |
| 5,420,060 A | * | 5/1995 | Gill et al. ...................... 437/52 |
| 5,780,900 A | * | 7/1998 | Suzuki et al. ................ 257/335 |
| 5,893,729 A | * | 4/1999 | Roisen et al. ............... 438/163 |
| 5,969,387 A | | 10/1999 | Letavic et al. | |
| 5,973,341 A | * | 10/1999 | Letavic et al. .............. 257/287 |
| 6,028,337 A | * | 2/2000 | Letavic et al. .............. 257/347 |
| 6,127,703 A | * | 10/2000 | Letavic et al. .............. 257/347 |
| 6,133,591 A | * | 10/2000 | Letavic et al. .............. 257/139 |
| 6,221,737 B1 | | 4/2001 | Letavic et al. | |
| 6,232,636 B1 | | 5/2001 | Simpson et al. | |
| 6,310,378 B1 | * | 10/2001 | Letavic et al. .............. 257/347 |
| 6,372,559 B1 | * | 4/2002 | Crowder et al. ............ 438/157 |
| 2002/0175380 A1 | * | 11/2002 | Shirahata et al. ........... 257/369 |

* cited by examiner

*Primary Examiner*—Amir Zarabian
*Assistant Examiner*—Monica Lewis
(74) *Attorney, Agent, or Firm*—Aaron Waxler

(57) ABSTRACT

A dual gate oxide high-voltage semiconductor device and method for forming the same are provided. Specifically, a device formed according to the present invention includes a semiconductor substrate, a buried oxide layer formed over the substrate, a silicon layer formed over the buried oxide layer, and a top oxide layer formed over the silicon layer. Adjacent an edge of the top oxide layer, a dual gate oxide is formed. The dual gate oxide allows both specific-on-resistance and breakdown voltage of the device to be optimized.

13 Claims, 3 Drawing Sheets

DUAL GATE OXIDE HIGH-VOLTAGE SEMICONDUCTOR DEVICE

BACKGROUND OF THE INVENTION

1. Field of the Invention

The present invention generally relates to a dual gate oxide high-voltage semiconductor (SOI) device. More particularly, the present invention relates to a high-voltage semiconductor device, such as a lateral MOSFET or a diode, having two gate oxides for optimizing breakdown voltage and specific-on-resistance.

2. Background Art

In fabricating high-voltage power devices, tradeoffs and compromises must often be made in areas such as breakdown voltage, specific-on resistance, size, conduction losses, manufacturing simplicity, and reliability. Frequently improvement of one characteristic such as breakdown voltage can lead to degradation in another such as specific-on-resistance. For example, to reduce the specific-on-resistance of a device, silicon doping is often increased. However, an increase in doping causes an increase in a magnitude of the electric field, which degrades the breakdown voltage of the device. Thus, the specific-on-resistance and breakdown voltage can be competing concerns.

Heretofore, several attempts have been made to improve the basic SOI structure. U.S. Pat. Nos. 5,246,870 and 5,300,448, both commonly assigned with the present application and herein incorporated by reference, attempt to improve breakdown voltage by providing a linear doping profile in the drift region. Specifically, these SOI devices include a drift region positioned between a body region and a drain region. The drift region is provided with various features such as a thinned portion and a linear lateral doping intensity profile in an attempt to provide increased breakdown voltage. However, to maintain high breakdown voltage, the total amount of conduction charge near the source side of the drift region must be kept very small. This often leads to bottlenecking for current flow, and preventing optimum reduction in conduction losses.

Another improvement over the basic SOI structures is shown in U.S. Pat. Nos. 5,969,387 and 6,221,737, both commonly assigned with the present application and herein incorporated by reference. These references disclose a SOI device (and method for forming the same) having a graded top oxide and drift region in an attempt to yield a better tradeoff between breakdown voltage and saturation current. However, the formation of the graded top oxide and drift region of these references relies upon a two-dimensional oxidation process in which an oxidation mask is patterned with a series of sequential openings.

In view of the foregoing, a need exists for a high-voltage SOI device in which both breakdown voltage and specific on-resistance can be optimized. A further need exists for a high-voltage SOI device having a dual gate oxide so that doping in the silicon can be increased without increasing the magnitude of the vertical electric field.

SUMMARY OF THE INVENTION

The present invention overcomes the drawbacks associated with other devices by providing a dual gate high-voltage semiconductor device. The dual gate oxide of the present invention allows the figures of merit for a high-voltage device (i.e., breakdown voltage and specific-on-resistance) to be improved. Specifically, the device of the present invention includes a semiconductor substrate, a buried oxide layer over the substrate, a silicon layer over the buried oxide layer, a first gate oxide over the silicon layer adjacent a top oxide layer, and a second gate oxide over the first gate oxide. By forming the second gate oxide, the doping in the drift region of the silicon layer can be increased without increasing the magnitude of the vertical electric field. This allows the specific-on-resistance of the device to be reduced without degrading the breakdown voltage.

According to a first aspect of the present invention, a dual gate oxide high-voltage semiconductor device is provided. The device comprises: (1) a buried oxide layer formed over a semiconductor substrate; (2) a silicon layer formed over the buried oxide layer; (3) a top oxide layer formed over the silicon layer; (4) a first gate oxide formed over the silicon layer adjacent the top oxide layer; and (5) a second gate oxide formed over a portion of the first gate oxide.

According to a second aspect of the present invention, a dual gate oxide high-voltage semiconductor device is provided. The device comprises: (1) a buried oxide layer formed over a semiconductor substrate; (2) a silicon layer formed over the buried oxide layer, wherein the silicon layer comprises a source region, a body region, a drift region, and a drain region; (3) a top oxide layer formed over the silicon layer; (4) a first gate oxide formed over the silicon layer adjacent the top oxide layer; and (5) a second gate oxide formed over a portion of the first gate oxide between the top oxide layer and the body region.

According to a third aspect of the present invention, a method for forming a dual gate oxide high-voltage semiconductor device is provided. The method comprises: (1) forming a buried oxide layer over a semiconductor substrate; (2) forming a silicon layer over the buried oxide layer; (3) forming a top oxide layer over the silicon layer; (4) forming a first gate oxide adjacent the top oxide layer over the silicon layer; and (5) forming a second gate oxide over the first gate oxide.

Therefore, the present invention provides a dual gate high-voltage semiconductor device and method for forming the same.

BRIEF DESCRIPTION OF THE DRAWINGS

These and other features of this invention will be more readily understood from the following detailed description of the various aspects of the invention taken in conjunction with the accompanying drawings in which.

Figure 1:
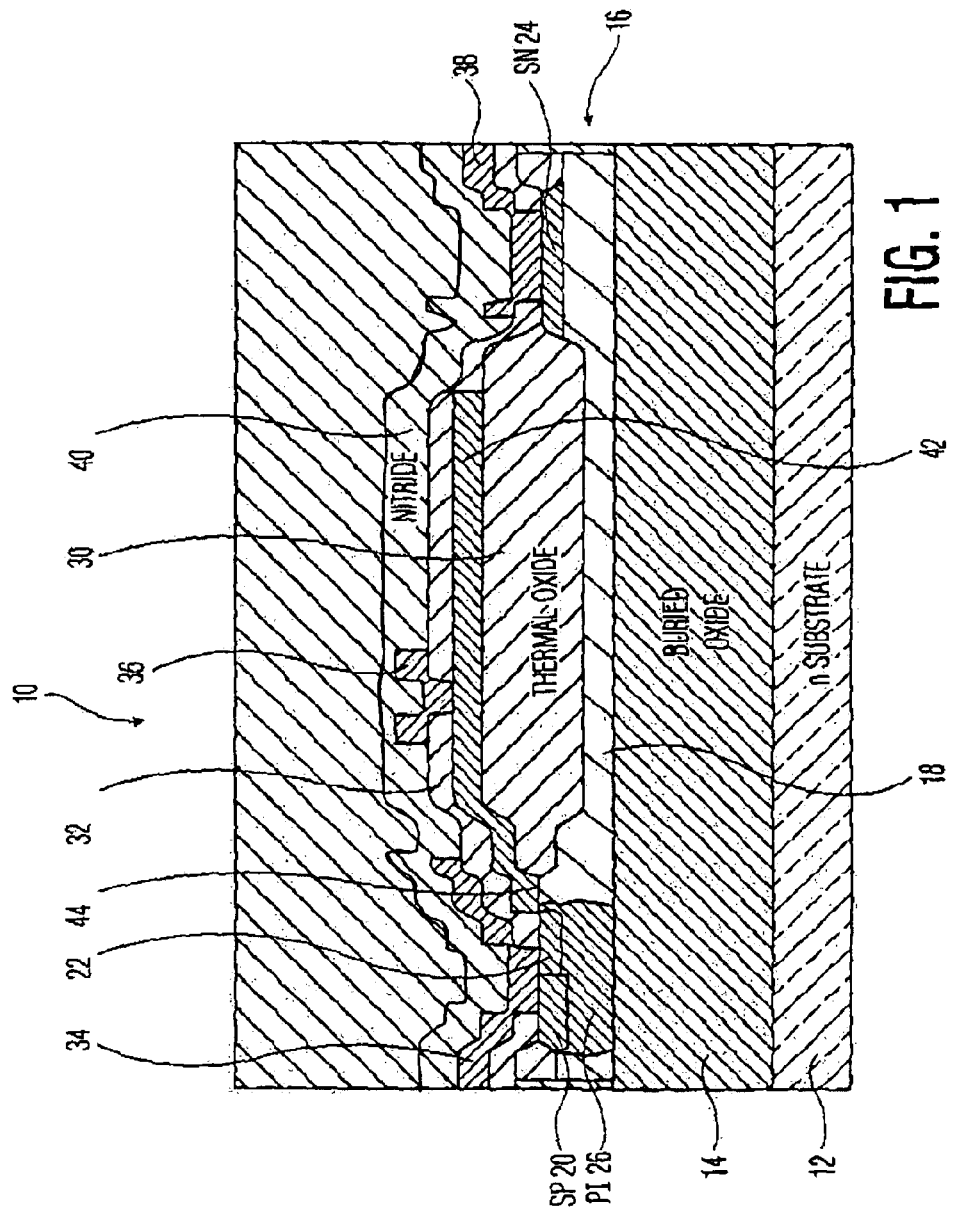
FIG. 1 depicts related art semiconductor device.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

In general, the present invention provides a dual gate oxide high-voltage semiconductor device. Specifically, a high-voltage device, such as a lateral MOSFET, constructed according to the present invention is provided with a dual gate oxide so that the breakdown voltage can be increased while the specific-on-resistance of the device can be decreased.

Referring now to FIG. 1, a related art high-voltage semiconductor device 10 is shown. As shown, silicon (SOI) layer 16 is formed over silicon substrate 12 with buried oxide layer 14 interposed therebetween. Silicon layer 16 is doped as known in the art by providing a mask (e.g., a patterned photoresist layer) on silicon layer 16 and implanting ions, as described in detail in U.S. Pat. No. 5,300,448. Top or thermal oxide layer 30 is formed using a standard Local Oxidation of Silicon (LOCOS) technique. This involves growing a pad oxide layer on silicon layer 16 and then depositing a silicon nitride layer on the pad oxide layer. Top oxide layer 30 is then grown to appear as shown. The resulting silicon layer 16 has a thinned lightly doped drain or drift region 18 below top oxide layer 30.

Once top oxide layer 30 is formed, gate oxide 44 is grown and field plate 42 is deposited. Once field plate 42 has been deposited, N+ source region 22 and N+ drain region 24 are formed along with P+ source region 20 and channel or body region 26. As further shown in FIG. 1, plate oxide layer 32, source contact 34, gate contact 36, and drain contact 38 could then be formed followed by nitride layer 40.

Figure 2:
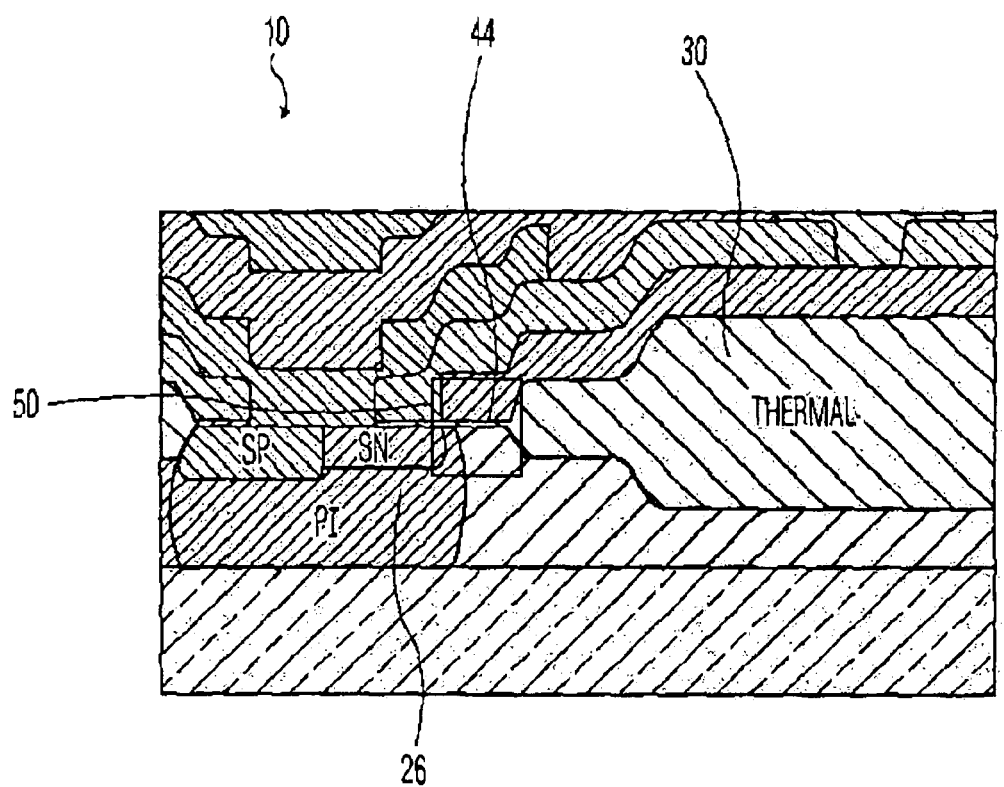
FIG. 2 depicts an enlarged view of the device of FIG. 1.

As depicted, device 10 on FIG. 1 includes a single gate oxide 44. Such a device fails to optimize breakdown voltage and specific-on-resistance. In particular, because breakdown voltage and specific-on-resistance are generally competing concerns, improvement of one often harms the other. Under the present invention, an additional gate oxide is formed to allow breakdown voltage to be increased while specific-on-resistance is decreased. Referring to FIG. 2, an enlarged view of device 10 is shown. Under the present invention, device 10 is modified to provide an additional gate oxide on top of existing gate oxide 44 in region 50. The additional gate oxide is positioned between top oxide layer 30 and body region 26.

Figure 3:
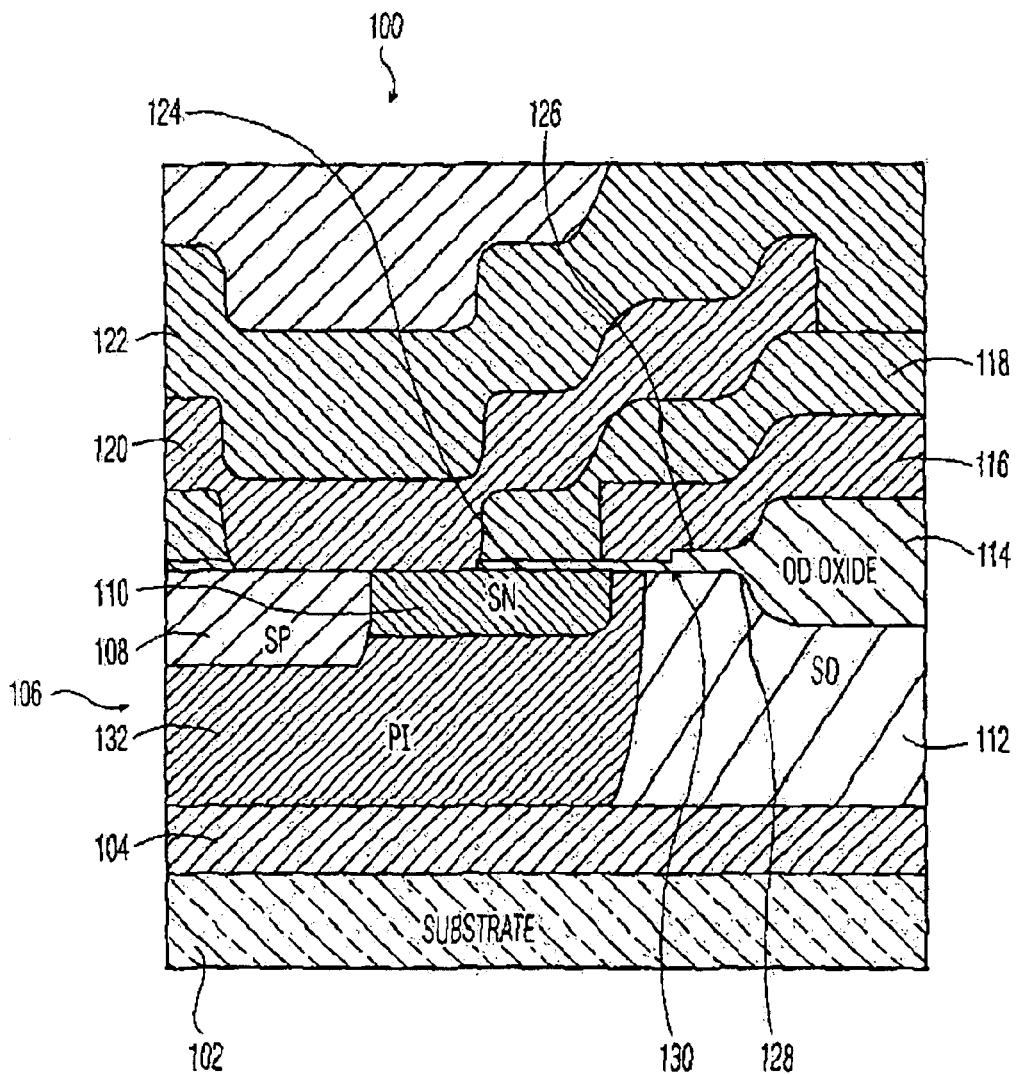
FIG. 3 depicts an enlarged view of a semiconductor device having a dual gate oxide, according to the present invention.

Referring to FIG. 3, a device 100 according to the present invention is shown. Device 100 is a high-voltage semiconductor device such as a lateral MOS transistor and generally includes, among other things: (1) substrate 102; (2) buried oxide layer 104; (3) silicon layer 106 having P+ source region 108, N+ source region 110, N+ drain region (not shown), channel or body region 132, and drain or drift region 112; (4) top oxide layer 114; (5) field plate 116; (6) plate oxide layer 118; (7) source contact 120; (8) gate and drain contacts (not shown) and (9) nitride layer 122. Unlike previous devices, however, device 100 includes a second gate oxide 126 over first gate oxide 124.

Device 100 is constructed by forming silicon layer 106 over buried oxide layer 104, which is formed over semiconductor substrate 102. Silicon layer 106 is doped by providing a mask and then implanting ions, as known in the art. The specific doping profile of silicon layer 106 is not intended to be a limiting part of the invention. Top oxide layer 114 is formed over silicon layer 106.

First gate oxide 124 is formed after top oxide layer 114 is grown, adjacent edge 128. This is typically accomplished by stripping any materials adjacent edge 128 after top oxide layer 114 is formed. Once stripping is complete, first gate oxide 124 is grown on the "stripped" surface. First gate oxide 124 generally extends from edge 128 to N+ source region 110 (i.e., to form a MOS inversion channel). Second gate oxide 126 is then formed over first gate oxide 124 in gate region 130. In one embodiment, second gate oxide 126 is formed using a LOCOS process as described above.

Specifically, a silicon nitride mask is deposited over first gate oxide 124 and second gate oxide 126 is grown. As depicted, second gate oxide 126 is positioned between top oxide 114 and body region 132 (i.e., over an accumulation channel region). Once second gate oxide 126 has been formed, the remainder of the device 100 (e.g., field plate 116, plate oxide 118, contact 120, nitride layer 122) can be formed using known procedures.

By providing device 100 with a dual gate oxide, the competing concerns of breakdown voltage and specific-on-resistance are optimized. Specifically, breakdown voltage is increased while specific-on-resistance is decreased. In general, to reduce the specific-on-resistance, the doping in silicon layer 106 should be increased. However, as indicated above, increasing the doping in previous devices causes an increase in the magnitude of the vertical electric field, which harms the breakdown voltage. Under the present invention, second gate oxide 126 allows the doping in silicon layer 106 to be increased while not elevating the vertical electric field. Specifically, since the total applied voltage is supported across the both the depleted silicon and the gate oxide, a dual or thicker gate oxide will reduce the magnitude of the vertical electric field in the silicon layer 106 for a given applied bias. Since the magnitude of the vertical electric field in the silicon layer 106 is directly proportional to the doping in the silicon layer 106, second gate oxide 126 results in an increase in the maximum allowable charge (i.e., breakdown voltage) in the silicon layer 106 directly beneath the second gate oxide 126 (i.e., drift region 112). Thus, the present invention allows specific-on-resistance to be reduced while still allowing for maximum charge to be placed in drift region 112, consistent with conventional multi-depletion Reduced Surface Electric Field (RESURF) design criteria.

Under the present invention, first gate oxide 124 has a thickness of about 300–600Å and a length of approximately 2–4 $\mu$m. Second gate oxide 126 has a thickness of about 900–1200Å and a length of approximately 1–2 $\mu$m. For a 1200Å thick second gate oxide 126, the maximum allowable charge (i.e., breakdown voltage) for device 100 increases from approximately $1e^{12}cm^{-2}$ to approximately $2e^{12}cm^{-2}$. Moreover, the minimum charge in the drift region 112 can be increased by a factor of two, resulting in substantial reduction in specific-on-resistance. For example, the increased value of charge is accompanied by approximately a 30% decrease in specific-on-resistance and a 55% increase in high-side saturated current flow in a 550V device structure. The decrease in on-resistance and the increase in high-side saturated current flow also result in an identical scaling of the total device size, dependent on whether the size is determined by total desired on-resistance or total maximum high-side current.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims. Accordingly, it should be understood that the precise structure of device 100, other than having a dual gate oxide, is not intended to be a limiting feature of the present invention. For example, top oxide layer 114 need not be stepped as shown in FIGS. 1–3, rather top oxide layer 114 could be shaped as shown in U.S. Pat. No. 5,246,870.

What is claimed is:

1. A dual gate oxide high-voltage semiconductor device, comprising:
   a buried oxide layer formed over a semiconductor substrate;
   a silicon layer formed over the buried oxide layer;
   a top oxide layer formed over the silicon layer;
   a first gate oxide formed over the silicon layer adjacent the top oxide layer; and
   a second gate oxide formed over a portion of the first gate oxide that contacts, and is located directly above, a drift region of the silicon layer.

2. The device of claim 1, wherein the silicon layer comprises a source region, a body region, and a drift region.

3. The device of claim 2, wherein the first gate oxide is formed over the drift region, the body region, and the source region.

4. The device of claim 2, wherein the second gate oxide is formed over the first gate oxide between the top oxide layer and the body region.

5. The device of claim 1, further comprising a field plate formed over the top oxide layer, the first gate oxide, and the second gate oxide.

6. The device of claim 1, wherein the first gate oxide has a thickness in a range of approximately 300–600A, and wherein the second gate oxide has a thickness in a range of approximately 900–1200A.

7. The device of claim 1, wherein the first gate oxide has a length of approximately 3–4 µm, and wherein the second gate oxide has a length of approximately 1–2 µm.

8. A dual gate oxide high-voltage semiconductor device, comprising:
   a buried oxide layer formed over a semiconductor substrate;
   a silicon layer formed over the buried oxide layer, wherein the silicon layer comprises a source region, a body region, and a drift region;
   a top oxide layer formed over the silicon layer;
   a first gate oxide formed over the silicon layer adjacent the top oxide layer; and
   a second gate oxide formed over a portion of th first gate oxide that is located between the top oxide layer and the body region and that contacts, and is located directly above, the drift region of the silicon layer.

9. The device of claim 8, farther comprising a field plate formed over the top oxide layer, the first gate oxide and the second gate oxide.

10. The device of claim 8, wherein the first gate oxide has a thickness in a range of approximately 300–600A, and wherein the second gate oxide has a thickness in a range of approximately 900–1200A.

11. The device of claim 8, wherein the first gate oxide has a length of approximately 3–4 µm, and wherein the second gate oxide has a length of approximately 1–2 µm.

12. The device of claim 8, wherein a thickness of approximately 1200A of the second gate oxide results in an increase from approximately $1e^{12}cm^{-2}$ to approximately $2e^{12}cm^{-2}$ of a maximum allowable charge and a decrease of approximately 30% of a specific-on-resistance, of the device.

13. A dual gate oxide high-voltage semiconductor device, comprising:
   a buried oxide layer formed over a semiconductor substrate;
   a silicon layer formed over the buried oxide layer, wherein the silicon layer comprises a source region, a body region, and a drift region;
   a top oxide layer formed over the silicon layer;
   a first gate oxide formed over the silicon layer adjacent the top oxide layer; and
   a second gate oxide formed over a portion of the first gate oxide, wherein the second gate oxide and the first gate oxide form a stepped oxide region that contacts, and is located directly above, the drift region of the silicon layer.

* * * * *